United States Patent
Limb et al.

(10) Patent No.: US 8,968,985 B2
(45) Date of Patent: Mar. 3, 2015

(54) METHOD AND SYSTEM FOR PATTERNING A MASK LAYER

(75) Inventors: Scott Jong Ho Limb, Palo Alto, CA (US); Eric J. Shrader, Belmont, CA (US); Uma Srinivasan, Mountain View, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 584 days.

(21) Appl. No.: 11/731,689

(22) Filed: Mar. 30, 2007

(65) Prior Publication Data

US 2008/0241712 A1 Oct. 2, 2008

(51) Int. Cl.
G03F 7/20 (2006.01)
H05K 3/00 (2006.01)
H05K 3/28 (2006.01)

(52) U.S. Cl.
CPC ............ G03F 7/2018 (2013.01); H05K 3/0082 (2013.01); H05K 3/0023 (2013.01); H05K 3/28 (2013.01); H05K 2203/0551 (2013.01)
USPC ...................................................... 430/311

(58) Field of Classification Search
USPC ............................................ 430/311, 322, 5
See application file for complete search history.

(56) References Cited

U.S. PATENT DOCUMENTS

| | | | |
|---|---|---|---|
| 4,429,027 A | 1/1984 | Chambers, Jr. et al. | |
| 5,894,036 A * | 4/1999 | Tylko | 427/279 |
| 6,742,884 B2 | 6/2004 | Wong et al. | |
| 6,872,320 B2 | 3/2005 | Wong et al. | |
| 6,890,050 B2 | 5/2005 | Ready et al. | |
| 6,972,261 B2 | 12/2005 | Wong et al. | |
| 7,033,516 B2 | 4/2006 | Wong et al. | |
| 7,384,568 B2 | 6/2008 | Wong et al. | |
| 7,524,015 B2 | 4/2009 | Srinivasan et al. | |
| 7,559,619 B2 | 7/2009 | Ready et al. | |
| 7,696,096 B2 | 4/2010 | Limb | |
| 7,835,583 B2 | 11/2010 | Jackson | |
| 7,926,900 B2 | 4/2011 | Srinivasan et al. | |
| 7,998,868 B2 | 8/2011 | Limb | |
| 8,079,656 B2 | 12/2011 | Srinivasan et al. | |
| 8,120,122 B2 | 2/2012 | Limb | |

(Continued)

FOREIGN PATENT DOCUMENTS

| | | |
|---|---|---|
| EP | 1 251 398 A2 | 10/2002 |
| JP | 04-301086 | 10/1992 |

(Continued)

OTHER PUBLICATIONS

European Search Report, Dec. 2008.

*Primary Examiner* — Brittany Raymond
(74) *Attorney, Agent, or Firm* — Fay Sharpe LLP

(57) ABSTRACT

The presently described embodiments use a printing process, e.g. a wax printing technique, to pattern a mask layer (such as a soldermask layer) of, for example, a printed circuit. Substantially all other conventional processes in developing soldermask and exposure processes can be maintained. According to the presently described embodiments, each printed circuit will have a unique pattern that matches uniform and non-uniform runout. In one form, the pattern is comprised of wax single drops having a specified gap to make the process transparent to the current industry practice. Furthermore, the single drops can be used for both large and small areas without any development time differences. In at least one form, the wax pattern and the soldermask in the gap are removed during development.

22 Claims, 8 Drawing Sheets

(56) References Cited

U.S. PATENT DOCUMENTS

| | | |
|---|---|---|
| 2003/0112312 A1 | 6/2003 | Gelbart |
| 2004/0259345 A1* | 12/2004 | Yu et al. .................. 438/613 |
| 2005/0136358 A1 | 6/2005 | Paul et al. |
| 2005/0164121 A1* | 7/2005 | Anzures et al. ............ 430/270.1 |
| 2006/0063369 A1 | 3/2006 | Lu et al. |

FOREIGN PATENT DOCUMENTS

| | | |
|---|---|---|
| JP | 2003-283111 | 10/2003 |
| WO | WO 98/51750 A | 11/1998 |

* cited by examiner

METHOD AND SYSTEM FOR PATTERNING A MASK LAYER

CROSS REFERENCE TO RELATED PATENTS AND APPLICATIONS

This application is related to U.S. Pat. No. 6,872,320, issued Mar. 29, 2005, entitled "Method for Printing Etch Masks Using Phase Change Materials," which is incorporated herein by reference.

BACKGROUND

The final lithography step in printed circuit manufacturing is mask patterning. Although a variety of ultraviolet curable materials could be used, a negative photoactive soldermask material is typically patterned using an ultraviolet (UV) source and a hard mask. With reference FIG. 1(a), a printed circuit, such as a printed circuit board 10, with a copper pattern 12 and a soldermask layer 14 disposed thereon is shown. Runout is measured. In addition, an appropriate pattern mask 16 is selected and positioned for a patterning operation.

Typically, the soldermask layer is coated, or otherwise formed, on the printed circuit board 10 and the combination is then soft baked. The mask 16 is then applied. As shown in FIG. 1(b), the printed circuit board 10 is exposed to, for example, ultraviolet light through the pattern mask 16. In the case where a negative photoactive soldermask is used, areas that are not masked, such as areas 18, in the soldermask are cross-linked during the exposure. The pattern mask 16 is then removed and, as shown in FIG. 1(c), the arrangement is developed so that the areas of the soldermask that were not cross-linked are removed during development. In this process, the copper pattern 12 is exposed so that electrical contact can be established.

However, in using methods such as that shown in FIGS. 1(a)-1(c), various difficulties arise. For example, because the run-out varies and is large using this type of technique, several different "stretched" masks 16 are used to match layer-to-layer alignment. This limits the layer-to-layer accuracy and, for cases where the run-out is very large or non-uniform, the printed circuit board 10 typically needs to be scraped. In addition, using multiple masks 16 increases run time and process errors.

Also, systems that use wax patterning are known. However, these systems require that extra steps be taken in the process to remove the wax, which can be difficult.

Thus, a method to individually and digitally stretch a mask without significantly changing the current industry process is desired. Such a system would improve yield, productivity and reduce linewidth tolerances.

INCORPORATION BY REFERENCE

This application is related to U.S. Pat. No. 6,872,320, issued Mar. 29, 2005, entitled "Method for Printing Etch Masks Using Phase Change Materials," which is incorporated herein by reference.

BRIEF DESCRIPTION

In one aspect of the presently described embodiments, the method comprises determining a mask pattern for a mask to be applied to, for example, a soldermask layer, forming the mask on the soldermask layer, exposing the soldermask layer and mask to ultraviolet light and developing a pattern in the soldermask layer such that the mask and corresponding underlying material are removed during the developing to expose the selected portions of the printed circuit board.

In another aspect of the presently described embodiments, the method comprises soft baking a soldermask layer on a printed circuit board, analyzing the fiducial marks on the printed circuit board to determine alignment and orientation of the printed circuit board, generating a mask pattern to be applied to the soldermask layer using the determined alignment and orientation, forming the mask pattern on the soldermask layer using wax material, exposing the soldermask layer and wax material to ultraviolet light, developing a pattern in the soldermask layer such that the wax material and corresponding underlying material are removed during the developing to expose the selected portions of the printed circuit board and hard baking the patterned soldermask material on the printed circuit board.

In another aspect of the presently described embodiments, the mask comprises a continuous outline having dots positioned therein.

In another aspect of the presently described embodiments, the forming of the mask pattern comprises printing the mask on the soldermask layer.

In another aspect of the presently described embodiments, the printing comprises emitting drops of wax material on the soldermask layer in a half-tone pattern.

In another aspect of the presently described embodiments, the half-tone pattern comprises a first outline.

In another aspect of the presently described embodiments, the half-tone pattern comprises a second pattern.

In another aspect of the presently described embodiments, the printing comprises emitting drops of wax material on the soldermask layer to form nested circles.

In another aspect of the presently described embodiments, the printing comprises emitting drops of wax material on the soldermask layer to form lines.

In another aspect of the presently described embodiments, the lines form a grid pattern.

In another aspect of the presently described embodiments, the lines form nested polygons.

In another aspect of the presently described embodiments, the developing further comprises removing portions immediately adjacent the underlying material.

In another aspect of the presently described embodiments, a means is provided to implement the methods.

DETAILED DESCRIPTION

The presently described embodiments use a printing process, e.g. a wax printing technique, to pattern a mask layer (such as a soldermask layer) of, for example, a printed circuit. Substantially all other conventional processes in developing soldermask and exposure processes can be maintained. According to the presently described embodiments, each printed circuit, e.g. a printed circuit board (PCB), will have a unique pattern that matches uniform and non-uniform runout. The pattern, in one form, is comprised of single drops of wax having a specified gap therebetween to make the process transparent to the current industry practice. Furthermore, the single drops can be used for both large and small areas without any development time differences. In at least one form, the wax pattern and the soldermask in the gap are removed during development.

One advantage is that large areas and small areas can be patterned without loading effect and can be patterned evenly, due to uniform wax lifting. This process allows for runout matching for better registration and is transparent to current developing methods.

It should be understood that, although the examples herein focus on patterning a soldermask layer, other types of ultraviolet curable materials may be patterned using the presently described embodiments. In this regard, for example, other types of material such as SU-8 may be patterned.

Figure 2:
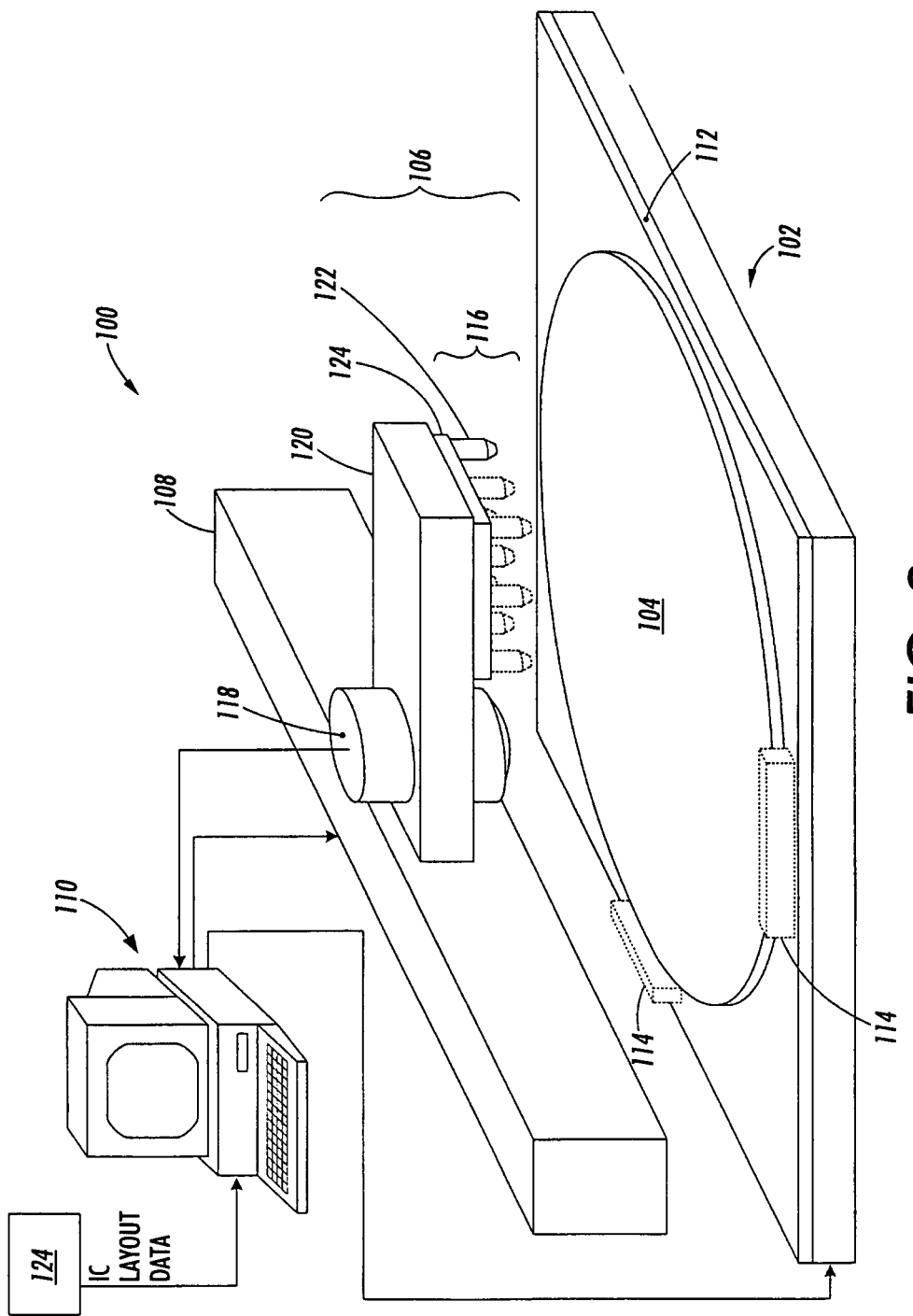
FIG. 2 illustrates an exemplary system into which the presently described embodiments may be incorporated.

With reference to FIG. 2, a perspective view of a printing system 100 into which the presently described embodiments may be implemented is illustrated. Notably, while the presently described embodiments are described with respect to printed circuits such as printed circuit boards for explanatory purposes, such embodiments can be applied to any situation in which homogenous, smooth-walled features in a printed pattern are required. The printing system 100 includes a stage 102 for supporting (and optionally translating or conveying) a substrate 104, a print assembly 116 mounted to a printing support structure 120, and a computer/workstation 110 that serves as both a system controller and data processor. Stage 102 includes a rotational platform 112 that allows the orientation of substrate 104 to be adjusted. Optional alignment features 114 on rotational platform 212 can be included to provide gross positioning and capture of substrate 104. Print assembly 106 includes a print head 116 (on a rotational fixture) and a camera 118 (having high magnification capabilities) mounted in a rigid mount 120. Print head 116 includes one or more ejectors 122 mounted in an ejector base 124. Ejectors 122 are configured to dispense droplets of a printing fluid on substrate 104. Depending on the type and intended use of the printed pattern being formed, the printing fluid can comprise a variety of materials, including phase-change materials such as wax or photoresist (to form semiconductor process masks), and colloidal suspensions such as solution-processable electronic (i.e., conducting, semiconducting, or dielectric) materials, and organic or inorganic materials (e.g., to form IC features). Substrate 104 can comprise any material on which patterning can be performed, such as a wafer, a glass plate, or even flexible materials such as fabric or plastics. As will be discussed subsequently, ejectors 122 can be in various arrangements and orientations, according to various embodiments of the invention.

Computer/workstation 110 is configured to receive PCB layout data from a data source 124, and then provide appropriate control signals to printing support structure. Data source 124 can comprise any source of layout data, including a networked computer, a layout database connected via a local area network (LAN) or wide area network (WAN), or even a CD-ROM or other removable storage media. The control signals provided by computer/workstation 110 control the motion and printing action of the print head as it is translated relative to the substrate. Note that the printing action can be provided by printing support structure, by stage, or by both in combination. Note further that the printing action does not have to involve actual movement of the print head itself, as print head could be held stationary while stage translates the substrate. Computer/workstation 110 is also coupled to receive and process imaging data from camera 118. As will be described subsequently, camera 118 can provide both manual and automated calibration capabilities for printing system 100.

To obtain the desired pattern results from printing system 100, the layout data is appropriately processed, print head 116 is configured, and print head 116 is accurately aligned and calibrated with respect to stage 102.

Figure 3:
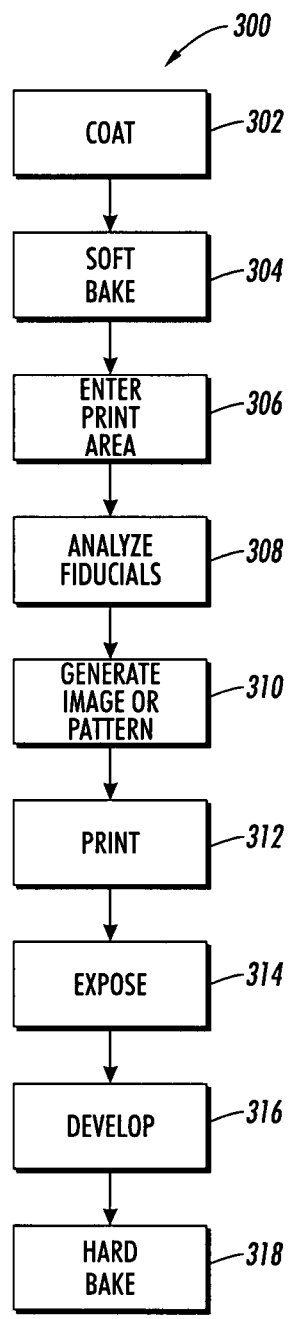
FIG. 3 is a flow chart illustrating a method that can be used in the system of FIG. 2 according to the presently described embodiments.
Figure 4A:
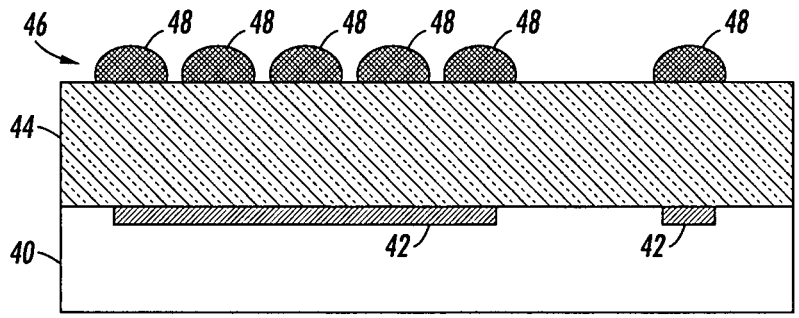
FIG. 4(a)-4(d) illustrate a process for patterning a soldermask layer in accordance with the presently described embodiments.
Figure 4B:
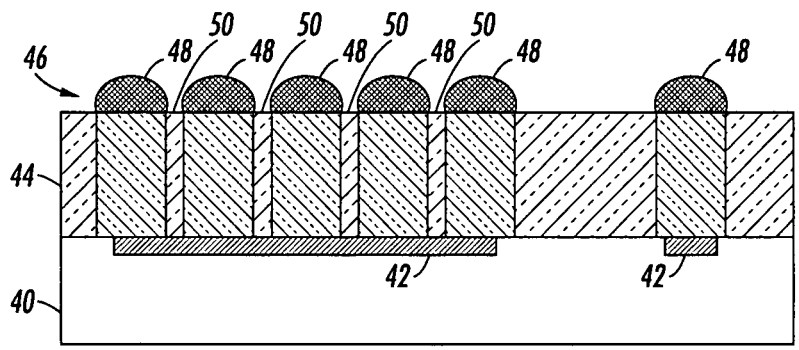
Figure 4C:
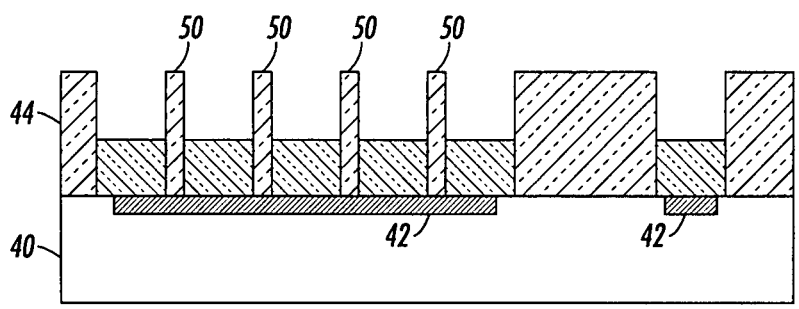
Figure 4D:
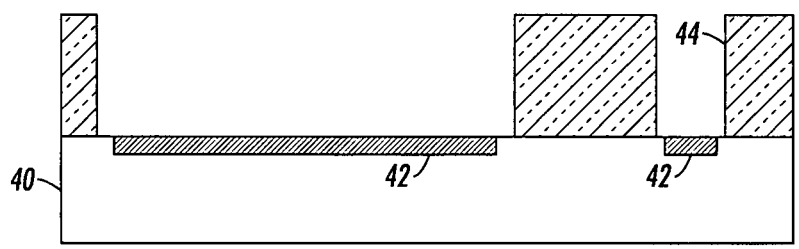
Figure 5A:
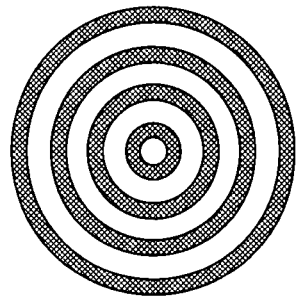
FIG. 5 illustrates a variety of patterns that could be implemented with the presently described embodiments.
Figure 5B:
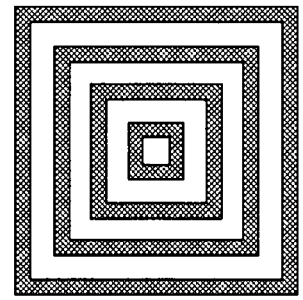
Figure 5C:
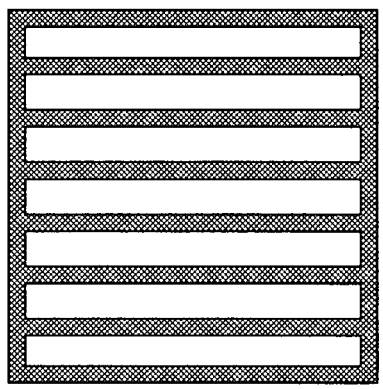
Figure 5D:
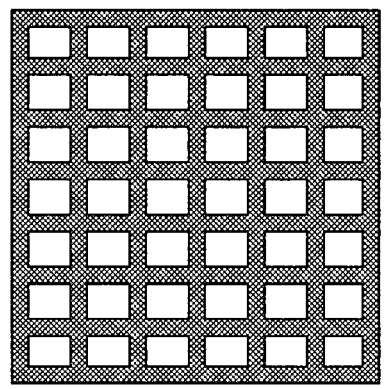
Figure 5E:
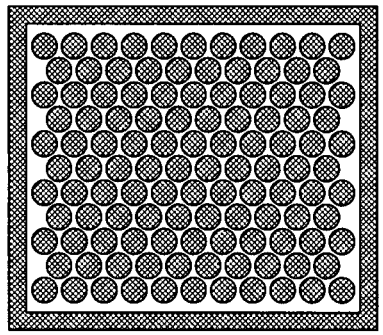

With reference now to FIG. 3, a method 300 according to the presently described embodiments is described. It should be appreciated that this method 300 may be implemented using a variety of different hardware configurations and/or software techniques, including those described in connection with the system 100 shown in FIG. 2. So, for example, software routines that implement various functions of the method may reside in and may be executed by the computer 110. The print system 106 may be used to print the contemplated mask pattern, as described in more detail below.

Figure 1A:
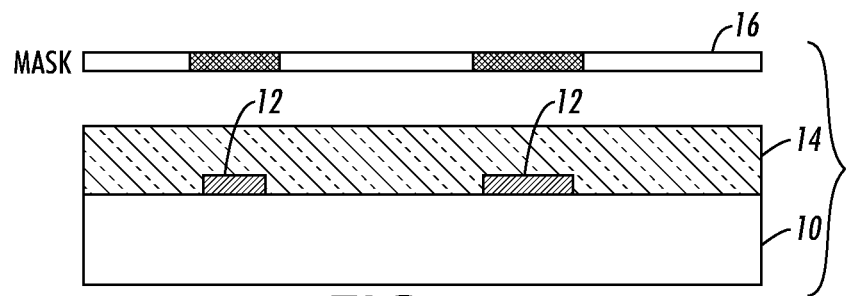
FIGS. 1(a)-1(c) illustrate a conventional technique for patterning a soldermask layer.
Figure 1B:
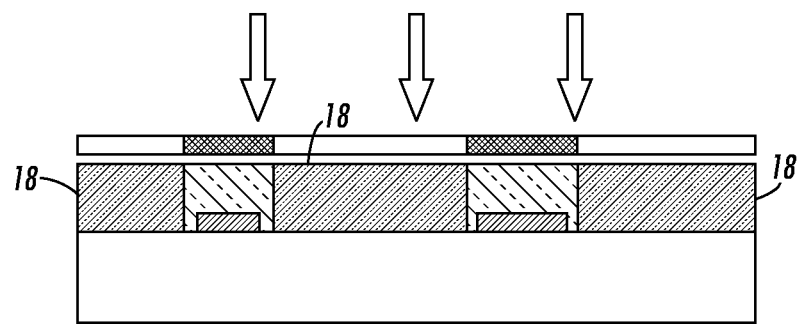
Figure 1C:
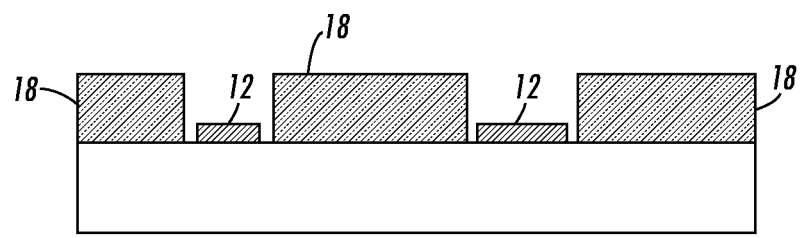

However, the method 300 includes a variety of steps, such as coating and baking (or exposing and developing), that may not be implemented using the system of FIG. 1. Implementation of any such steps is accomplished using conventional techniques which require no further explanation than is provided herein. Of course, as explained in more detail below, in one form, the developing will include the removal of the wax pattern and portions of soldermask in accord with the presently described embodiments.

Referring back now to FIG. 3, an initial step of coating a printed circuit, such as the printed circuit board 10 shown in FIG. 1, with a mask layer such as a soldermask layer using conventional techniques is achieved (at 302). Using conventional techniques, the soldermask is then soft-baked onto the printed circuit board 10 (at 304).

Then, the printed circuit board is sent to an area or zone wherein analysis and printing functions may take place (at 306). It should be appreciated that the zone may include a printer station that may take a variety of forms, including that shown in FIG. 1. For example, the printer station may be a modular unit that can be incorporated within a circuit board assembly process line.

In any event, however, the printed circuit board is analyzed by the printer station (such as a system 100) using, for example, fiducial marks on the printed circuit board. In this way, the alignment and/or orientation that need to be achieved to print a suitable pattern on the soldermask are determined (at 308). The techniques for analyzing fiducials on a printed circuit board are well known in the art.

Next, an image or pattern to be printed (e.g. a mask pattern) is generated (at 310). It should be appreciated that the image or pattern may be generated in a variety of different manners, including that which will be described hereafter in connection with FIG. 7.

After the image or pattern is generated, the print system prints the mask based on the mask pattern on the soldermask (at 312). It should be understood that the printing step may not be necessary. For example, the image or pattern (or mask) could be disposed or formed on the soldermask using other masking techniques. However, in one form, using a printing process provides for overall efficiency and improved performance.

After the pattern is printed, the circuit board is positioned at an appropriate station (which may or may not be at the printer station) and exposed to ultraviolet light, for example (at 314). This exposure, as noted above, initiates cross-linking within the soldermask material in areas that are exposed. As such, areas in the soldermask that are not exposed because of the placement of the image or pattern, are not cross-linked and can then be removed in development. In this regard, the pattern on the soldermask layer of the printed circuit board is developed (at 316). Typically, the development process involves spraying of any of a variety of different chemical formulations, such as potassium carbonate ($K_2CO_3$) or sodium carbonate ($Na_2CO_3$), on the printed circuit board. In the process of developing, as will be described in more detail in examples hereafter, the wax pattern and soldermask beneath the wax pattern is suitably removed to expose the desired areas of the circuit board. Portions of the soldermask that are immediately adjacent the soldermask beneath the wax pattern are also removed during the developing. Typically, the exposed areas are those that correspond to copper pads that are useful for electrical connection for the circuit board.

Last, after the developing, the circuit board is hard-baked (at 318) using conventional techniques. This completes the process.

To further explain by way of example, with reference now to FIGS. 4(*a*)-4(*d*), an example printed circuit board 40 is illustrated. The printed circuit board has a copper pattern 42 disposed thereon as well as a soldermask 44 suitably positioned over the printed circuit board 40 and the copper pattern 42. Also shown in FIG. 4(*a*) is a mask pattern 46. It should be appreciated that the mask pattern comprises a plurality of drops 48. The drops 48, in one form, are placed on the soldermask via a printing process, as described above. The mask pattern 46 may also be deposited on the soldermask using other suitable techniques. It should also be understood that the drops 48 are comprised of a suitable wax or other water soluble material. However, any material, such as other material that can be printed or patterned, that can meet the objectives of the presently described embodiment would be appropriate. In at least one form, the material would have similar qualities as wax to the extent that wax serves to block ultraviolet radiation during the exposure process, and thus acts as a blocking material.

With reference to FIG. 4(*b*), the entire combination is then exposed to, for example, ultraviolet light. As shown, the exposure allows for areas of the soldermask that do not correspond to wax drops to become cross-linked. In this regard, note the cross-linked dams 50 that form under the gaps between the drops.

FIG. 4(*c*) shows the combination during the beginning stages of the development process. As can be seen, the wax pattern and significant portions of the uncross-linked soldermask are removed. In one form, the wax pattern is lifted off evenly within about 30 seconds. Note that the cross-linked dams 50 remain at this point in the process.

FIG. 4(*d*) illustrates the combination after the development has completed. As can be seen, the remaining portions of the uncross-linked soldermask are removed, along with the dams 50 that were formed during the process. It should be appreciated that undercutting the dams 50 during the development process, as well as the limited physical adhesion areas of the dams 50 to the underlying copper pattern, allow for the soldermask dams 50 to lift-off of the copper to fully expose the desired area.

It should be understood that the relative dimensions of the components described herein are factors in the implementation of the presently described embodiments. For example, the relative dimensions of the dams 50 are a function of the printer capabilities and govern the limitations of the implementations of the presently described embodiments. For example, the spacing between the drops is a function of the limits of the printing device. Likewise, the size of the drops can be a function of the printing device that is used. I From a practical perspective, the ratio between the thickness of the soldermask and the spacing between the wax drops should be tuned so that the dams 50 are of an appropriate size for removal during development. In this regard, in one form, the ratio between the thickness of the soldermask and the spacing is approximately 4:1. It should be appreciated that ratios in the range of 2:1 and 3:1 may also suffice.

With reference now to FIG. 5(*a*)-5(*e*), a variety of different example patterns (e.g. wax patterns) are illustrated. For example, FIG. 5(*a*) shows a pattern having circles within circles, e.g. nested circles. FIG. 5(*b*) shows a pattern showing boxes within boxes (e.g. nested boxes). Of course, any polygon would suffice. FIG. 5(*c*) shows a pattern having horizontal (or vertical) lines. FIG. 5(*d*) illustrates a waffle-type pattern. Last, FIG. 5(*e*) shows a half-tone pattern. It should be appreciated that any of these patterns could be used as, for example, the pattern 46 shown in the process of FIG. 4. In addition, a combination of these types of patterns may be used.

It should be appreciated, however, that the half-tone pattern illustrated in FIG. 5(*e*) is particularly advantageous for printed circuit, such as printed circuit board, applications where a printing process is used to place the mask on, for example, the soldermask layer. In this regard, printing is typically accomplished using dots, so the half-tone pattern is advantageous. The patterns illustrated in FIGS. 5(*a*)-5(*d*), while more suitable for some applications, may present problems in implementation if dots are used in the printing process. The intersections of lines in the pattern could create undesired build-up of material or other effects that might render formation or removal more difficult. Of course, these difficulties could be overcome with more precise printing techniques and/or may not impact the process sufficiently to warrant avoiding use of the patterns. So, these patterns, as well as others, may be used satisfactorily in the contemplated process, whether or not printing of material is accomplished.

As noted above, the presently described embodiments may be implemented in a variety of different manners to achieve a variety of different results. In this regard, an advantage of the presently described embodiments is the adaptability of the system to a variety of different situations. The system may be used to generate a pattern which can be properly aligned with a printed circuit on a circuit-by-circuit basis to achieve improved results for the quality of the circuits being produced. So, while it should be understood that a variety of different variations of the presently described embodiments may be implemented, one example of an implementation of the presently described embodiments will be described in connection with FIGS. 6-9.

Figure 6:
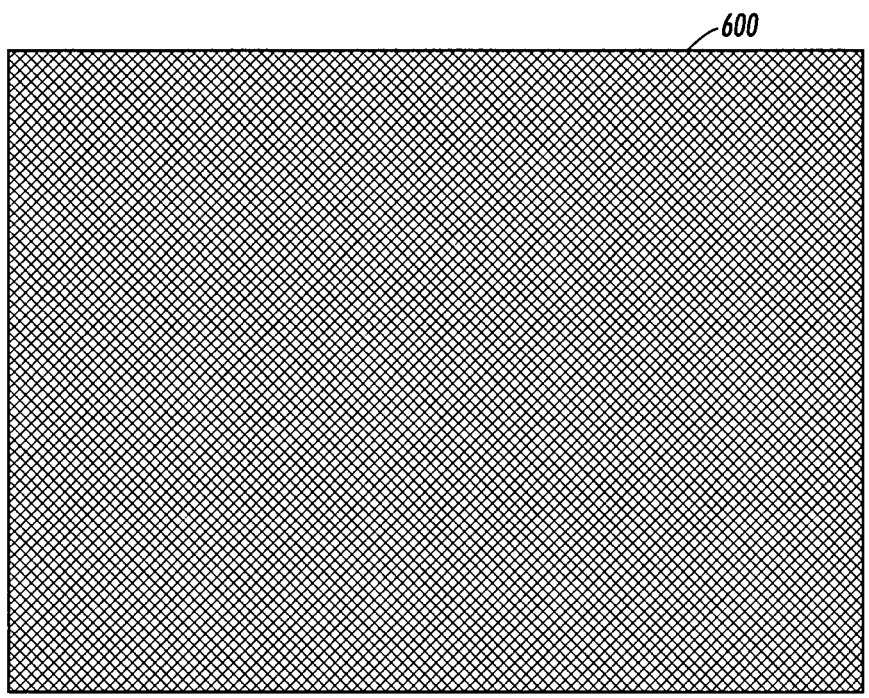
FIG. 6 illustrates a desired pattern that can be implemented using the presently described embodiments.

In this regard, with reference to FIG. 6, an example of an image 600 is illustrated. Note that the image 600 is simply a rectangle that represents a mask pattern that is desired to be applied to a circuit, such as the printed circuit board shown in connection with FIG. 4. Ultimately, the image 600 represents the shape of the portion of the soldermask that is to be removed to expose selected portions of the printed circuit.

Figure 7:
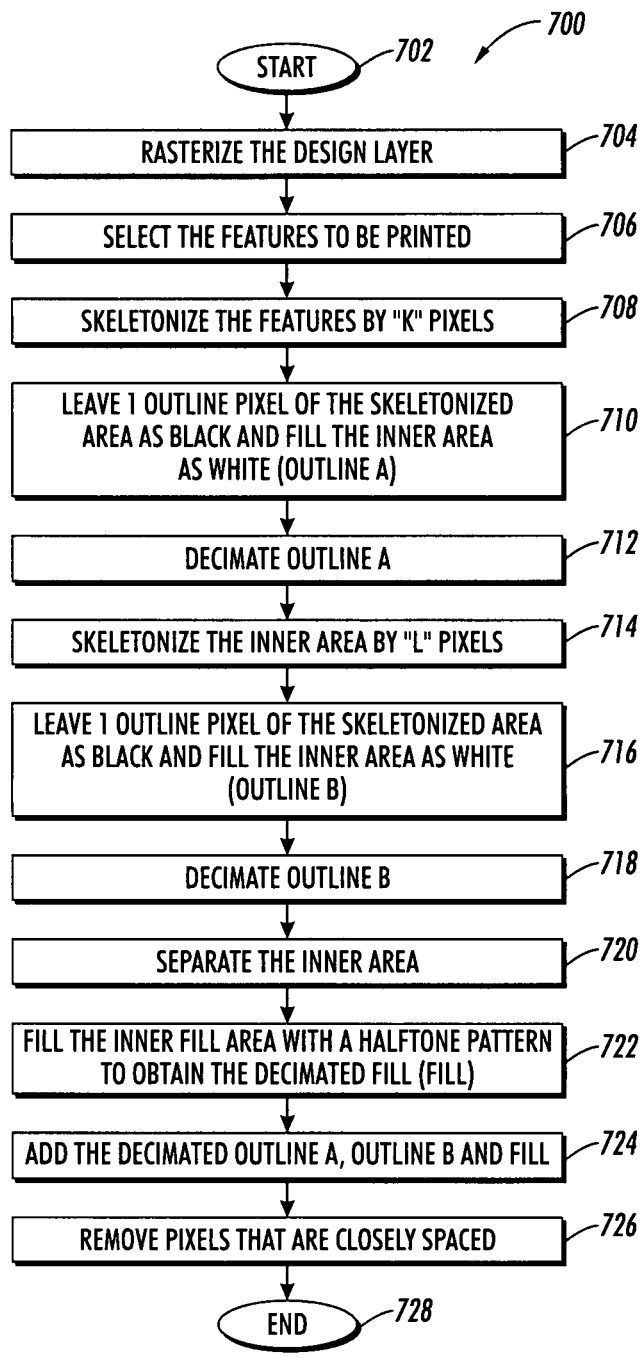
FIG. 7 illustrates a method for generating a suitable pattern according to the presently described embodiments.
Figure 8:
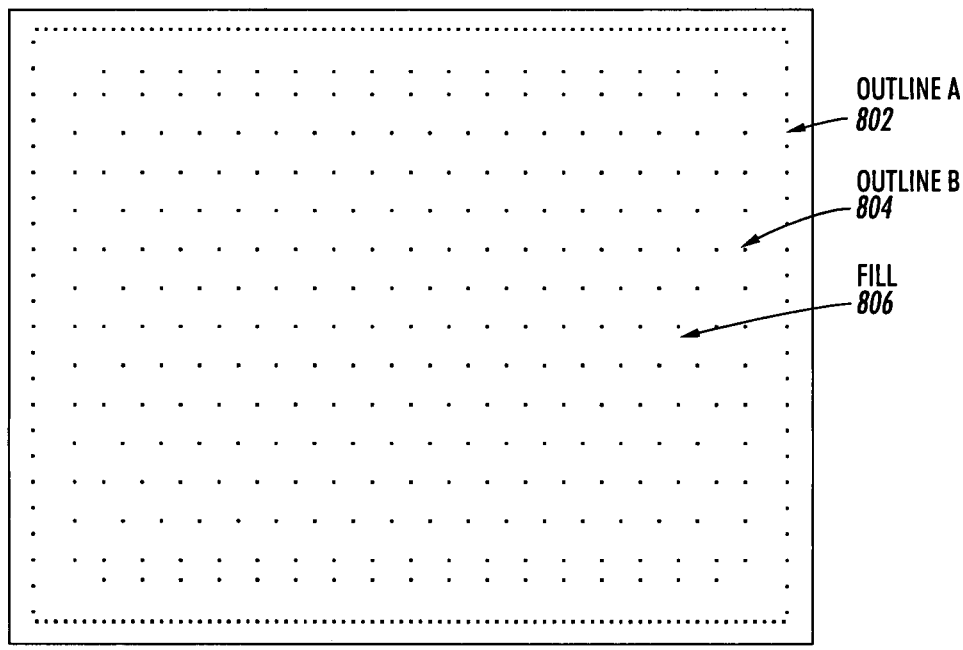
FIG. 8 illustrates a form of a generated pattern according to the presently described embodiments; and, FIG. 9 illustrates a printed image according to the pattern of FIG. 8 according to the presently described embodiments.

With reference now to FIG. 7, a flow chart illustrating the technique to generate a corresponding mask pattern to achieve the pattern of FIG. 6 is illustrated. Also, FIG. 8 shows a decimated image, or an image showing the dot pattern used to achieve the shape, of the image 600.

So, with reference now to FIG. 7, a method 700 is initiated (at 702). It should be appreciated that the method 700 corresponds to the step 310 of FIG. 3 for generating an image or pattern. This method may be implemented by, for example, the computer 110 of FIG. 2.

As shown, the design layer, or image of the printed circuit, is rasterized (at 704). From the rasterized image, features of the circuit board for which a pattern is to be generated are selected to be printed (at 706).

Next, the feature to be printed, such as the feature 600 of FIG. 6, is skeletonized by "K" pixels (at 708). "K" is defined as (drop radius/cell size) for these purposes. Cell size is the size or width of the pixel that is to be printed. The process leaves one outline pixel of the skeletonized area as black and fills the inner area in as white to achieve an outline A, as shown at 802 of FIG. 8 (at 710). Outline A is then decimated (at 712).

The inner area is then skeletonized by "L" pixels (at 714). "L" is defined as ((drop diameter+desired gap+system errors)/cell size) for these purposes. The process then leaves one outline pixel of the skeletonized area as black and fills in the remaining inner area as white to achieve outline B, as shown at 804 of FIG. 8 (at 716). Outline B is then decimated (at 718). The inner area is then separated from the outlines (at 720). The inner area is then filled in with a half-tone pattern to obtain the decimated fill shown at 806 of FIG. 8 (at 722). The decimated outline A, outline B and fill are then added together as in FIG. 8 (at 724). Any pixels that are too closely spaced are removed (at 726). The process ends at 728.

Figure 9:
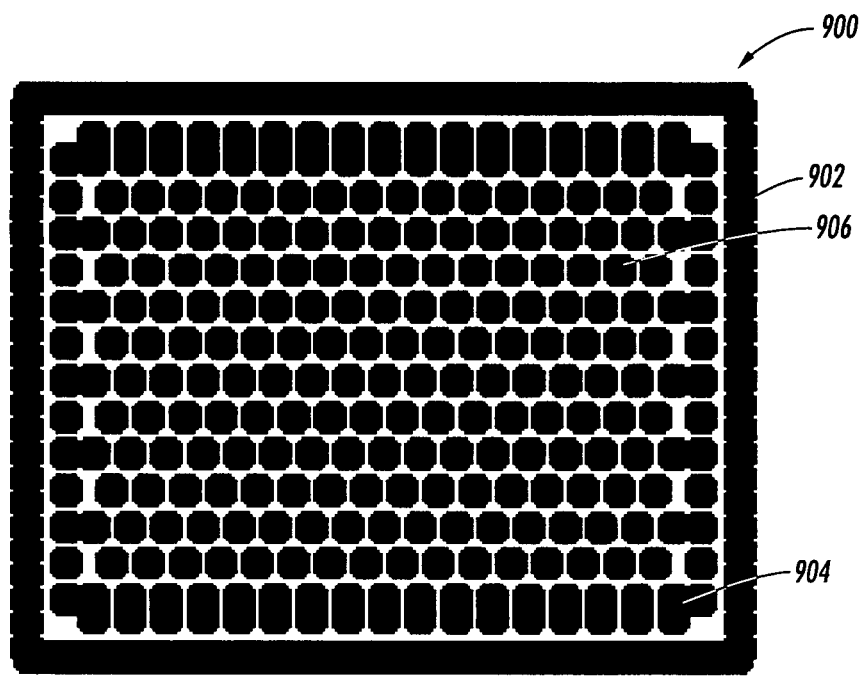

It should be understood that the pattern 800 shown in FIG. 8 is then used as a bitmap for printing. With reference now to FIG. 9, a corresponding printed pattern 900 is shown. As illustrated, a continuous outline having strategically spaced dots or drops (or regions of material) therewithin comprises the pattern. In this regard, the pattern 900 comprises an outline 902 which corresponds to the outline A of FIG. 8. An inner outline 904 corresponds to outline B (804) of FIG. 8. Last, the dots shown in the fill area of the pattern 900, such as wax dot 906, correspond to the fill (806) that is illustrated in FIG. 8.

It should be understood that the pattern 900 can then be used to achieve an area corresponding to image 600 of FIG. 6 in accordance with the presently described embodiments, including the techniques of FIGS. 3 and 4.

It will be appreciated that various of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

The invention claimed is:

1. A method for forming a pattern in a layer of ultraviolet curable material on a printed circuit to expose selected portions of the printed circuit, the method comprising:
    determining a mask pattern for a mask to be applied to the layer;
    forming the mask based on the mask pattern on the layer, the mask having dense and isolated features;
    exposing the layer and the mask to ultraviolet light; and,
    developing a pattern in the layer such that the mask, corresponding underlying material of the layer, and dams formed during the exposing under corresponding gaps between the dense features and immediately adjacent the underlying material, are removed during the developing to expose the selected portions of the printed circuit.

2. The method as set forth in claim 1 wherein the ultraviolet curable material layer is a soldermask layer.

3. The method as set forth in claim 1 wherein the mask comprises a continuous outline having dots positioned therein.

4. The method as set forth in claim 1 wherein the forming of the mask comprises printing the mask on a soldermask layer.

5. The method as set forth in claim 4 wherein the printing comprises emitting drops of wax material on the soldermask layer in a half-tone pattern.

6. The method as set forth in claim 5 wherein the half-tone pattern comprises a first outline.

7. The method as set forth in claim 6 wherein the half-tone pattern comprises a second pattern.

8. The method as set forth in claim 4 wherein the printing comprises emitting drops of wax material on the soldermask layer to form circles.

9. The method as set forth in claim 4 wherein the printing comprises emitting drops of wax material on the soldermask layer to form lines.

10. The method as set forth in claim 9 wherein the lines form a grid pattern.

11. The method as set forth in claim 9 wherein the lines form polygons.

12. The method as set forth in claim 1 wherein the dams are removed as a result of limited adhesion to the printed circuit.

13. A method for forming a pattern in a soldermask layer coated on a printed circuit board to expose selected portions of the printed circuit board, the printed circuit board having fiducial marks, the method comprising:
    soft baking the soldermask layer on the printed circuit board;
    analyzing the fiducial marks on the printed circuit board to determine alignment and orientation of the printed circuit board;
    generating a mask pattern to be applied to the soldermask layer using the determined alignment and orientation;
    forming the mask pattern on the soldermask layer using wax material, the formed mask pattern having dense and isolated features;
    exposing the soldermask layer and wax material to ultraviolet light;
    developing a pattern in the soldermask layer such that the wax material, corresponding underlying material of the soldermask layer, and dams formed during the exposing under corresponding gaps between the dense features and immediately adjacent the underlying material, are removed during the developing to expose the selected portions of the printed circuit board; and,
    hard baking the patterned soldermask material on the printed circuit board.

14. The method as set forth in claim 13 wherein the forming of the mask pattern comprises printing the mask pattern on the soldermask layer.

15. The method as set forth in claim 14 wherein the printing comprises emitting drops of wax material on the soldermask layer in a half-tone pattern.

16. The method as set forth in claim 15 wherein the half-tone pattern comprises a first outline.

17. The method as set forth in claim 16 wherein the half-tone pattern comprises a second pattern.

18. The method as set forth in claim 14 wherein the printing comprises emitting drops of wax material on the soldermask layer to form nested circles.

19. The method as set forth in claim 14 wherein the printing comprises emitting drops of wax material on the soldermask layer to form lines.

20. The method as set forth in claim 19 wherein the lines form a grid pattern.

21. The method as set forth in claim 19 wherein the lines form nested polygons.

22. The method as set forth in claim 13 wherein the dams are removed as a result of limited adhesion to the printed circuit board.

\* \* \* \* \*